United States Patent
Kim

(10) Patent No.: US 10,652,120 B2
(45) Date of Patent: May 12, 2020

(54) VOICE QUALITY MONITORING SYSTEM

(71) Applicant: DOLBY LABORATORIES LICENSING CORPORATION, San Francisco, CA (US)

(72) Inventor: Doh-Suk Kim, Cupertino, CA (US)

(73) Assignee: Dolby Laboratories Licensing Corporation, San Francisco, CA (US)

(*) Notice: Subject to any disclaimer, the term of this patent is extended or adjusted under 35 U.S.C. 154(b) by 48 days.

(21) Appl. No.: 15/571,198

(22) PCT Filed: May 5, 2016

(86) PCT No.: PCT/US2016/030965
§ 371 (c)(1),
(2) Date: Nov. 1, 2017

(87) PCT Pub. No.: WO2016/179382
PCT Pub. Date: Nov. 10, 2016

(65) Prior Publication Data
US 2018/0287918 A1    Oct. 4, 2018

Related U.S. Application Data

(60) Provisional application No. 62/158,134, filed on May 7, 2015.

(30) Foreign Application Priority Data

Oct. 13, 2015  (EP) ..................................... 15189489

(51) Int. Cl.
*H04L 12/26* (2006.01)
*H04L 29/06* (2006.01)
(Continued)

(52) U.S. Cl.
CPC ........ *H04L 43/0829* (2013.01); *H03M 13/01* (2013.01); *H03M 13/015* (2013.01);
(Continued)

(58) Field of Classification Search
CPC ............... H04L 43/0829; H04L 1/0045; H04L 41/5067; H04L 65/80; H03M 13/01; H03M 13/63
See application file for complete search history.

(56) References Cited

U.S. PATENT DOCUMENTS 6,366,959 B1    4/2002  Sidhu
7,167,451 B1    1/2007  Oran
(Continued)

FOREIGN PATENT DOCUMENTS

WO        2013/010153        1/2013

OTHER PUBLICATIONS

Boutremans, C. et al "Adaptive Joint Playout Buffer and FEC Adjustment for Internet Telephony" Infocom IEEE Computer and Communications, IEEE Societies (vol. 1) Mar. 30-Apr. 3, 2003, pp. 652-662.
(Continued)

*Primary Examiner* — Christopher M Crutchfield
*Assistant Examiner* — Tito Q Pham

(57) ABSTRACT

This disclosure falls into the field of voice communication systems, more specifically it is related to the field of voice quality estimation in a packet based voice communication system. In particular the disclosure provides methods, computer program products and devices for reducing a prediction error of the voice quality estimation by considering forward error correction of lost voice packets.

18 Claims, 4 Drawing Sheets

(51) Int. Cl.
*H03M 13/00* (2006.01)
*H04L 12/24* (2006.01)
*H04L 1/00* (2006.01)
*H03M 13/01* (2006.01)

(52) U.S. Cl.
CPC .......... *H03M 13/63* (2013.01); *H04L 1/004* (2013.01); *H04L 1/0045* (2013.01); *H04L 41/5067* (2013.01); *H04L 43/0823* (2013.01); *H04L 65/80* (2013.01)

(56) References Cited

U.S. PATENT DOCUMENTS

| | | | |
|---|---|---|---|
| 8,804,575 | B2 | 8/2014 | Kumar |
| 8,819,520 | B1 | 8/2014 | Slavetsky |
| 8,990,663 | B2* | 3/2015 | Liu ........................ H04L 1/0041 714/776 |
| 2007/0055498 | A1* | 3/2007 | Kapilow ............... G10L 19/005 704/206 |
| 2008/0212567 | A1* | 9/2008 | El-Hennawey ......... G10L 25/69 370/352 |
| 2009/0281797 | A1* | 11/2009 | Zopf ..................... G10L 19/005 704/207 |
| 2013/0100969 | A1 | 4/2013 | Vafin |
| 2013/0104006 | A1 | 4/2013 | Choi |
| 2013/0263201 | A1* | 10/2013 | Chung-How ......... H04L 1/0003 725/116 |
| 2015/0180785 | A1 | 6/2015 | Annamraju |
| 2015/0236967 | A1* | 8/2015 | Rozenberg ........... H04L 47/283 370/235 |
| 2015/0340046 | A1* | 11/2015 | Chen ....................... H04L 1/00 704/500 |
| 2016/0036564 | A1* | 2/2016 | Krishnan ................ H04L 1/008 714/748 |
| 2017/0034589 | A1* | 2/2017 | Rozenberg ....... H04N 21/64322 |

OTHER PUBLICATIONS

Rosenberg, J. et al "Integrating Packet FEC into Adaptive Voice Playout Buffer Algorithms on the Internet" Proc. IEEE Infocom, Mar. 2000, pp. 1-10.

Gong, Q. et al "Quality-Based Playout Buffering with FEC for Conversational VoIP" Proc. of the 11th Annual Conference of the International Speech Communication Association, Interspeech, Sep. 26-30, 2010, pp. 2402-2405.

Karapantazis, S. et al "VoIP: A Comprehensive Survey on a Promising Technology" Computer Networks, Elsevier Science Publishers, vol. 53, No. 12, Aug. 13, 2009, pp. 2052-2053.

* cited by examiner

VOICE QUALITY MONITORING SYSTEM

CROSS-REFERENCE TO RELATED APPLICATIONS

This application claims priority to U.S. Provisional Patent Application No. 62/158,134, filed on May 7, 2015 and European Patent Application No. 15189489.6, filed on Oct. 13, 2015, each of which is incorporated herein by reference in its entirety.

TECHNICAL FIELD

This disclosure falls into the field of voice communication systems, more specifically it is related to the field of voice quality estimation in a packet based voice communication system. In particular the disclosure provides methods, computer program products and devices for reducing a prediction error of the voice quality estimation by considering forward error correction of lost voice packets.

BACKGROUND ART

In previous years, Voice over internet protocol (VoIP) has become an important application and is expected to carry more and more voice traffic over TCP/IP networks.

In such Internet protocol (IP)-based voice communications systems, typically a voice waveform of a user is sliced in time, compressed by a voice coder, packetized, and transmitted to other users. Due to the inherent nature of IP networks and real-time constraint of human voice communications, it is common to lose voice packets during transmission or that late voice packets are discarded even if they are received, resulting in degraded voice quality. Mobile and WIFI networks usually make the situation worse in many cases. Thus, accurate real-time monitoring of voice quality is an advantagous feature for analysis, management, and optimization of voice communication systems.

A typical voice quality monitoring system adopts a scheme that analyzes packet loss information, such as packet loss rate and loss patterns (e.g., if the losses are random or of a bursty nature), as it provides a simple and computationally inexpensive way to estimate voice quality. This scheme is known as a modified E-model. However, these systems may suffer from low accuracy in estimating voice quality.

Many IP-based voice communications systems employ forward error correction (FEC) for recreating as many of the lost voice packets as possible. FEC provides the possibility of such recreation by adding redundant data streams, which are transmitted along with the voice packets. This may influence the voice quality as perceived by a user, since some of the lost voice packets may be recreated.

Thus, it is desirable to have a voice quality monitoring system utilizing both packet loss information and data about FEC.

BRIEF DESCRIPTION OF THE DRAWINGS

Example embodiments will now be described with reference to the accompanying drawings, on which.

All the figures are schematic and generally only show parts which are necessary in order to elucidate the disclosure, whereas other parts may be omitted or merely suggested. Unless otherwise indicated, like reference numerals refer to like parts in different figures.

DETAILED DESCRIPTION

Figure 1:
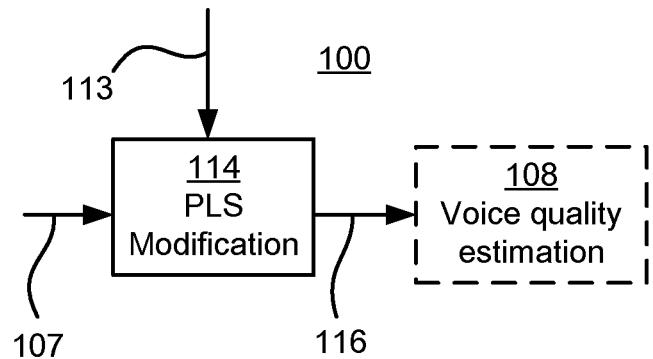
FIG. 1 shows a generalized block diagram of a device for modifying a statistical metric relating to lost voice packets in accordance with an example embodiment.

In view of the above it is an object to provide devices, computer program products, and associated methods which provide a reduced prediction error of a voice quality estimate by modifying conventional statistical metrics relating to lost voice packets based on recovery data relating to recovered voice packets, wherein the recovered voice packets are recovered using forward error correction.

I. OVERVIEW—MODIFYING STATISTICAL METRICS RELATING TO LOST VOICE PACKETS BASED ON FEC

According to a first aspect, example embodiments propose methods for modifying a statistical metric relating to lost voice packets, devices implementing the methods, and computer program product adapted to carry out the method. The proposed methods, devices and computer program products may generally have the same features and advantages.

According to example embodiments there is provided a first method for modifying a statistical metric relating to lost voice packets in a packet based voice communication system.

The method comprises receiving a statistical metric, the statistical metric being calculated based on
- a sequence of encoded voice packets received by a decoder and transmitted from one or more end-points in the voice communication system, and on
- one or more lost voice packets which were lost during the transmission from the one or more end-points or discarded due to latency and/or jitter in the transmission.

The method further comprises receiving recovery data relating to recovered voice packets among the one or more of the lost voice packets, wherein the recovered voice packets are recovered using a forward error correction, FEC, scheme and FEC data relating to the lost voice packets.

The method further comprises modifying the statistical metric based on the recovery data, and transmitting the modified statistical metric to a voice quality estimator so as to reduce a prediction error of a voice quality estimate when using the modified statistical metric as input to a voice quality estimating algorithm of the voice quality estimator.

This disclosure relates generally to a teleconferencing system comprising a plurality of telephone endpoints, and in particular to the improvement of perceived call quality when such a system experiences channel degradation.

By way of background, in a typical teleconferencing system, a mixer receives a respective uplink data stream from each of the telephone endpoints in a voice call, which carries an audio signal captured by that telephone endpoint, and sends a respective downlink data stream to each of the telephone endpoints. Consequently, each telephone endpoint receives a downlink data stream which carries a mixture of the respective audio signals captured by the other telephone endpoints. Accordingly, when two or more participants in a telephone conference speak at the same time, the other participant(s) can hear both participants speaking.

If there is a problem with the data channel which carries the downlink and uplink data streams to and from one of the endpoints, this may cause errors in the downlink and/or uplink data streams. The errors may be perceptible to the participant using said one of the endpoints, and/or to other participants in the voice call. The errors may result in lost voice packets which were lost during the transmission from the one or more end-points.

The errors may further result in jitter. Jitter is technically the measure of the variability over time of the latency across a network and is a common problem in a packet based voice communication system. Since the voice packets can travel by a different path from the sender to the receiver, the voice packets may arrive at their intended destination in a different order then they were originally sent. Even if a Jitter buffer is used to temporarily store arriving voice packets in order to minimize delay variations, some jitter characteristics exceed the capability of a jitter buffer and some voice packets may still be arriving too late. These packets are eventually discarded. This discarded voice packets are thus looked upon as lost voice packets which were discarded due to latency and/or jitter in the transmission.

This above discussed problems relating to the errors in the downlink and/or uplink data streams may result in that out of the encoded voice packets that are transmitted from the one or more end-points, some are lost during the transmission or discarded due to latency and/or jitter in the transmission, and the rest are received as a sequence of encoded voice packets.

As used herein an end-point refers to a telephone endpoint and/or a mixer.

The above method may be implemented in such an end-point (decoder, etc.) comprising a packet statistics modification module, or it may be implemented by a packet statistics modification module detached from the end-point (decoder, etc.) receiving the sequence of encoded voice packets transmitted from one or more end-points in the voice communication system. In the latter case, the packet statistics modification module may be implemented in a separate server, or as a cloud service or in any other suitable way.

The above method provides a simple and flexible way of reducing the prediction error of a voice quality estimate.

Moreover, an existing voice quality estimator may be reused, since the statistical metrics is only modified by using the packet statistics modification module. The modified statistical metric is transmitted to the voice quality estimator in the same way as the unmodified statistical metric would be if the packet statistics modification module was not implemented.

It should be noted that the statistical metric may comprise one or more statistical metrics.

As used herein FEC scheme refers to the implementation of FEC in the end-point (decoder, etc.) receiving the sequence of encoded voice packets transmitted from one or more end-points in the voice communication system. Examples of FEC schemes are media independent FEC (e.g. block codes and convolutional codes) or media specific FEC (e.g. involving replicating voice packets). An end-point (decoder, etc.) may handle a plurality of FEC schemes and select the correct one based on the received FEC data.

As used herein FEC data refers to the redundant data streams received by the end-point (decoder, etc.), which are used in combination with the FEC scheme to recover at least some of the lost voice packets.

The recovery data relates to recovered voice packets among the one or more of the lost voice packets, e.g. to which lost voice packets that were recovered using FEC, and is consequently based on the FEC scheme and the FEC data.

Conventional statistical metrics when calculating a voice quality estimate does not take into account FEC. Rather, only the information whether a voice packet is lost or received by the receiving end-point (decoder, etc.) is taken into account.

However, data about FEC may be very relevant for reducing a prediction error of a voice quality estimate since the recovered voice packets may increase the voice quality compared to if no FEC was used.

Moreover, the modification of the statistical metric may not only be done by subtracting the count of the recovered packets from the count of the lost packets. For example, depending on which of the lost voice packets that were reconstructed (this information may be understood from or included in the FEC data); the statistical metric may be modified differently. For example, if the statistical metric is based on a number of groups of consecutive lost voice packets, a recovered voice packet in the beginning or end of such a group may be treated differently compared to a recovered voice packet in the middle of such a group.

Moreover, the reconstruction of a lost voice packet may be done differently based on the used FEC scheme. According to some embodiments, the used FEC scheme may e.g. not fully reconstruct a lost voice packet which could result in a mixture of lost voice packets and partial recovered voice packets using FEC.

By reducing the prediction error, problems that may result in one or more participants perceiving degraded call quality can be detected earlier and/or more accurately and thus better handled.

According to some embodiments, the statistical metric comprises or is calculated using at least one of: a total number of transmitted voice packets from the one or more end-points in the voice communication system including a number of the one or more lost voice packets, a number of groups of consecutive lost voice packets, and the number of the one or more lost voice packets. Using one or more from the above list, conventional statistical metrics relating to voice quality in a packet based voice communication system may be calculated, e.g. a packet loss rate, PLR, which is the number of lost voice packets in relation to a total number of transmitted voice packets, and/or a burstiness factor, BF, which is one minus a number of groups of consecutive lost voice packets in relation to the number of lost voice packets. Moreover, by e.g. sending one or more from the above list of statistical metrics to the packet statistics modification module, instead or in addition to PLR and/or BF, the modification of the statistical metric based on the FEC scheme and FEC data may be more flexible.

According to some embodiments, the FEC scheme is a media specific FEC scheme.

According to some embodiments, the recovery data comprises information pertaining to a recovery factor of each of the recovered voice packets, wherein the step of modifying the statistical metric comprises weighting of the statistical metric using to the recovery factor of each of the recovered voice packets. As mentioned above, according to some FEC schemes, a lost voice packet is not fully recovered. This means that a recovered voice packet do not comprise all the information that was present in the lost voice packet that the recovered voice packet is replacing. This is something that is advantageously addressed by the packet statistics modification module when modifying the statistical metric. In other words, a partly recovered voice packet may be treated differently compared to a fully recovered voice packet when it comes to modifying the statistical metric.

According to some embodiments, the recovery factor of a recovered voice packet is calculated using a pre trained mapping function trained for determining a recovery factor based on the used FEC scheme and/or on the FEC data. For example, if the recovery factor is a value between 0 and 1 (1 indicates a fully recovered voice packet) and the FEC scheme and/or FEC data indicate that only 60% of the bits of a certain lost voice packet are recovered, the 60% recovered bits may not directly map to a recovery factor of 0.6. For example, the rate of the decrease of a perceived voice quality may be slow between 100-50 percent of recovered bits, while the rate is increasing if less than 50% of the bits of a lost voice packet are recovered. The optimal value of the recovery factor for different FEC schemes and/or FEC data may thus advantageously be pre-trained using a pool of speech data and listeners giving subjective score of the voice quality for different embodiments of FEC.

According to some embodiments, the FEC data are in the form of data packets, wherein a header of each data packet comprises information pertaining to the recovery factor of the one or more recovered voice packets. This is a convenient way of receiving the information pertaining to the recovery factor of the one or more recovered voice packets from e.g. a transmitting end-points in the voice communication system. According to other embodiments, the recovery factor is pre set to a fixed value between the encoder and decoder or within the packet based communication system.

According to some embodiments, the FEC data comprises replica data relating to at least some of the one or more of the lost voice packets, wherein the replica data is encoded with a codec having a first bit rate, wherein the encoded voice packets transmitted from the one or more end-points is encoded with a codec having a second bit rate being higher than the first bit rate, wherein the recovery factor of a recovered voice packet is determined based on a ratio between the first bit rate and the second bit rate.

In some media dependent FEC schemes, the lost packets are replaced by the lower bit rate version of the original packets to reduce the extra bandwidth required by the FEC data. In other words, a unit (e.g. a end-point, encoder etc.) creating the redundant data stream (FEC data) do this by adding replica data, relating to the sequence of encoded voice packets received by a decoder (e.g. the "main" data stream), to the FEC data, wherein the replica data may be encoded by a lower quality codec (i.e. resulting in lower bit rate versions of the packets in the "main" stream). This means that the recovery factor for a voice packet will be less than e.g. 1 (in the case 1 corresponds to a fully recovered voice packet) and can be determined based on a ratio between the first bit rate and the second bit rate.

According to some embodiments, wherein the statistical metric comprises a number of groups of consecutive lost voice packets and a number of lost voice packets, the step of modifying the statistical metric comprises: calculating a modified burstiness factor, $BF_{FEC}$, based on:
the number of groups of consecutive lost voice packets,
the number of lost voice packets,
the recovery factor of each of the one or more recovered voice packet,
a number of groups of consecutive lost voice packets in which all consecutive lost voice packets in a group are recovered, and
a number of groups of consecutive lost voice packets being split by a recovered voice packet.

Since the statistical metric is based on groups of consecutive lost voice packets, the pattern of the loss packets is taken into account. It should be noted that a group may comprise just one lost voice packets.

In a packet based voice communication system, random loss patterns may decrease the voice quality less than if the lost packets are grouped (e.g. a bursty loss pattern), since a larger number of consecutive lost voice packets may increase the risk of perceptually important data being lost. Consequently, the normal burstiness factor depends on number of groups of consecutive lost voice packets. This means that several outcomes of the FEC need to be considered along with the recovery factor of the recovered voice packet. For example, how to handle a group of lost voice packets which are all recovered but with a recovery factor below perfect recovery (e.g. below 1). Another example is how to handle a group of lost voice packet being split into two groups by a recovered packet. This embodiment may advantageously handle both scenarios.

According to some embodiments, the step of calculating a modified burstiness factor, $BF_{FEC}$, further comprises a mapping of the recovery factor of a recovered voice packet using a pre trained monotonically increasing non-linear mapping function. Since the modified burstiness factor take into account e.g. a split of a group of lost voice packets or completely recovered groups of lost voice packet but with a below perfect recovery factor, further mappings of the recovery factor may be advantageous for calculating the $BF_{FEC}$. The optimal value of such a mapping for different cases of FEC may be achieved by pre-trained using a pool of speech data and listeners giving subjective score of the voice quality for the different cases of FEC.

According to some embodiments, wherein step of modifying the statistical metric comprises:
calculating a modified packet loss rate, $PLR_{FEC}$, based on:
a packet loss rate, PLR, which is the number of lost voice packets in relation to a total number of transmitted voice packets,
a number of the one or more recovered voice packet in relation to the total number of transmitted voice packets, and
the recovery factor of each of the recovered voice packets.

Consequently, the modified packet loss rate may be calculated based on recovery factor of the recovered voice packets and thus better measure lost information in the voice call.

According to some embodiments, the recovery factor for each of the recovered voice packets are determined to be the same. For example, in the media dependent case, the replica data of the redundant data stream (FEC data) may all be encoded using the same lower bit rate codec. This may be advantageous since the recover factor of recovered voice packets only needs to be calculated once for e.g. a voice call using the packet based voice communication system. In other embodiments, the end-points concerned in the voice call may continuously adapt the bit rate of the FEC data (or even the FEC scheme) based on current network characteristics, e.g. available bit rate or transmission quality of the network.

According to example embodiments there is provided a second method for modifying a statistical metric relating to lost voice packets in a packet based voice communication system. The method comprises the steps of receiving data comprising a sequence of encoded voice packets transmitted from one or more end-points in the voice communication system, wherein encoded voice packets transmitted from the one or more end-points comprises the received sequence of encoded voice packets and one or more lost voice packets which were lost during the transmission from the one or more end-points or discarded due to latency and/or jitter in the transmission, wherein the data further comprises forward error correction, FEC, data relating to the encoded voice packets transmitted from the one or more end-points, calculating, based on the received sequence of encoded voice packets, a statistical metric relating to the lost voice packets, recovering one or more of the lost voice packets using a FEC scheme and the FEC data relating to the lost voice packets, and modifying the statistical metric based on the recovered one or more voice packets, so as to reduce a prediction error of a voice quality estimate when using the modified statistical metric as input to a voice quality estimating algorithm. This method may be implemented in a end-point in the voice communication system and may generally have the same features and advantages as the above described first method.

According to example embodiments there is provided a computer-readable medium comprising computer code instructions adapted to carry out any of the above described methods and embodiments when executed on a device having processing capability.

According to example embodiments there is provided a first device for modifying a statistical metric relating to lost voice packets in a packet based voice communication system, the first device being configured to:
 receive a statistical metric, the statistical metric being calculated based on a sequence of encoded voice packets received by a decoder and transmitted from one or more end-points in the voice communication system, and on one or more lost voice packets which were lost during the transmission from the one or more end-points or discarded due to latency and/or jitter in the transmission,
 receive recovery data relating to recovered voice packets among the one or more of the lost voice packets, wherein the recovered voice packets are recovered using a forward error correction, FEC, scheme and FEC data relating to the lost voice packets.
 modify the statistical metric based on the recovery data, and
 transmit the modified statistical metric to a voice quality estimator so as to reduce a prediction error of a voice quality estimate when using the modified statistical metric as input to a voice quality estimating algorithm of the voice quality estimator.

According to example embodiments there is provided a second device for modifying a statistical metric relating to lost voice packets in a packet based voice communication system.

The second device may comprise a receiving stage configured to receive data comprising a sequence of encoded voice packets transmitted from one or more end-points in the voice communication system, wherein encoded voice packets transmitted from the one or more end-points comprises the received sequence of encoded voice packets and one or more lost voice packets which were lost during the transmission from the one or more end-points or discarded due to latency and/or jitter in the transmission, wherein the data further comprises forward error correction, FEC, data relating to the encoded voice packets transmitted from the one or more end-points.

The second device may further comprise a calculating stage configured to calculate, based on the received sequence of encoded voice packets, a statistical metric relating to a number of lost voice packets.

The second device may further comprise a FEC recovery stage for recovering one or more of the lost voice packets using a FEC scheme and the FEC data relating to the lost voice packets, and a statistical modification stage configured to modify the statistical metric based on the recovered one or more voice packets, so as to reduce a prediction error of a voice quality estimate when using the modified statistical metric as input to a voice quality estimating algorithm.

II. EXAMPLE EMBODIMENTS

Figure 2:
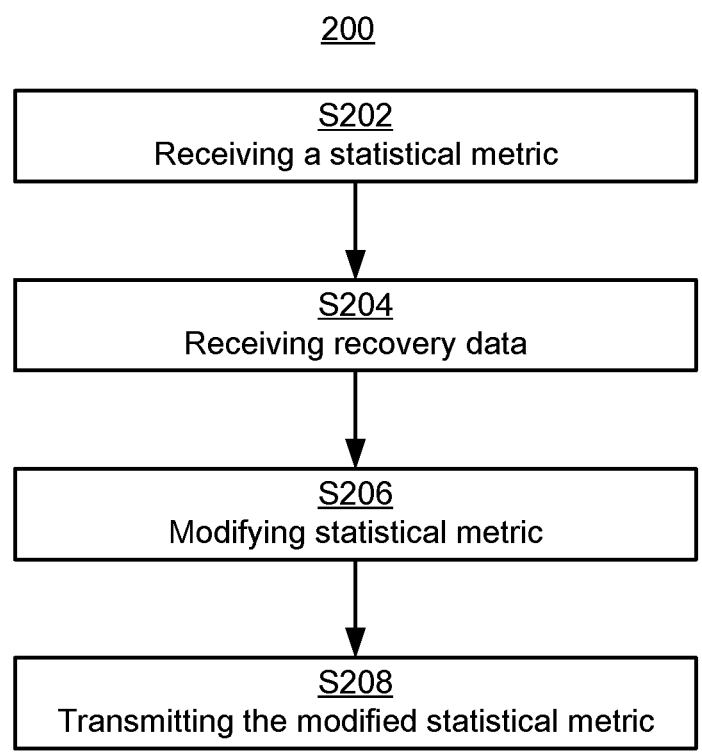
FIG. 2 shows by way of example a method for modifying a statistical metric relating to lost voice packets.

FIG. 1 shows by way of example a generalized block diagram of a device 100 for modifying a statistical metric. Such modification will now be described in conjunction with FIG. 2 which shows by way of example a method 200 for modifying a statistical metric relating to lost voice packets.

The device 100 is part of a packet based voice communication system. The device 100 comprises a packet loss statistics (PLS) modification unit 114 and may for example be implemented in an end-point in the voice communication system, for example a telephone or a computer running voice communication software, this embodiment is described in FIG. 3. The device 100 and the PLS modification unit 114 may also be in communication with such end-point but implemented separate from the end-point, for example in a cloud service. The device 100 comprises a processor which may implement the PLS modification 114 unit and which is configured to receive S202 a statistical metric 107. The statistical metric 107 may be calculated based on a sequence of encoded voice packets received by a decoder and transmitted from one or more end-points in the voice communication system, and on one or more lost voice packets which were lost during the transmission from the one or more end-points or discarded due to latency and/or jitter in the transmission. The statistical metric 107 may comprise or be calculated using at least one of:
 a total number of transmitted voice packets from the one or more end-points in the voice communication system including a number of the one or more lost voice packets,
 a number of groups of consecutive lost voice packets, and
 the number of the one or more lost voice packets.

According to some embodiments, one or more of metrics from the above list is received by the PLS modification unit 114. Additionally or alternatively, the statistical metric 107 received by the PLS modification unit 114 may relate to a burstiness factor, BF, which is one minus a number of groups of consecutive lost voice packets in relation to the number of lost voice packets. If, out of 10 lost voice packet, three groups of consecutive lost packets can be formed, e.g. comprising 1, 3 and 6 lost voice packet each, the BF equals $1-(3/10)=0.7$. Additionally or alternatively, the statistical metric 107 received by the PLS modification unit 114 may include a packet loss rate, PLR, which is the number of lost voice packets in relation to a total number of transmitted voice packets. For example, if 10 out of 100 voice packets are lost, the PLR equals 0.1.

The PLS modification unit 114 is also receiving S204 recovery data 113 relating to recovered voice packets among the one or more of the lost voice packets. The decoder, to which the PLS modification unit 114 is coupled, receiving the sequence of encoded voice packets may implement forward error correction (FEC) in order to improve voice quality such that lost voice packets in lossy channel can be recovered. This may be possible since the voice packets transmitted from the transmitting end point (encoder, etc,) are encoded in a redundant way. The decoder thus receives FEC data relating to the lost voice packets and comprising the redundant data which are used in combination with a FEC scheme to recover at least some of the lost voice packets.

The FEC scheme may for example be a media specific FEC scheme. The FEC data may in that case comprise replica data relating to at least some of the one or more of the lost voice packets. According to one embodiment, each voice packet transmitted from the transmitting end point in the packet based voice communication system carries a replica data of a voice packet previously transmitted. In other words, in some media specific FEC, the replica data of the m-th voice packet is piggybacked on the following transmitted voice packet, i.e. the voice packet m+1. To safeguard against burst errors, i.e. consecutive lost voice packets, the replica data of the m-th voice packet can be attached to the n-th next packet instead of the immediate subsequent packet (m+1), i.e. the voice packet m+n, at the cost of a decoding delay of n packets.

The PLS modification unit 114 is arranged to modify the statistical metric 107 based on the recovery data 113. This will be further described in conjunction with FIGS. 4-5.

The PLS modification unit 114 is further arranged to transmit S208 the modified statistical metric 116 to a voice quality estimator 108 so as to reduce a prediction error of a voice quality estimate when using the modified statistical metric as input to a voice quality estimating algorithm of the voice quality estimator. In other words, by modifying the statistical metric 107 based on the recovery data 113, an accuracy of the voice quality estimate made by the voice quality estimator 108 may be improved. This will be further described in conjunction with FIG. 6. According to some embodiments, the voice quality estimator 108 is part of the device 100 and implemented by a processor of the device 100, but according to other embodiments, the voice quality estimator 108 is implemented by a processor in a device separate from the device 100, e.g. in a server or cloud service.

Figure 3:
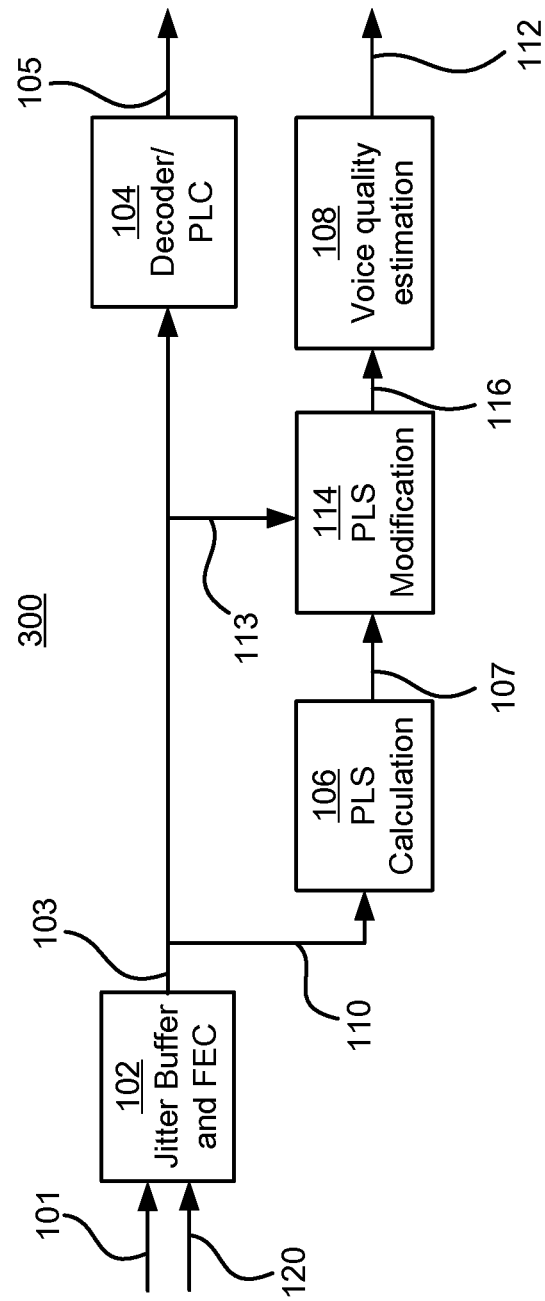
FIG. 3 shows a generalized block diagram of a device for estimating voice quality in accordance with an example embodiment.

FIG. 3 shows a generalized block diagram of a device 300 for estimating voice quality in accordance with an example embodiment.

The device 300 is part of a packet based voice communication system, e.g. a mixer or a telephone end-point in a teleconferencing system.

The device comprises a receiving stage 102 comprising a Jitter buffer and implementing FEC, and a stage 104 for decoding and packet loss concealment (PLC), and may be a typical voice processing unit at a receiver, e.g. a mobile phone. The Jitter buffer 102 typically is a buffer which receives incoming voice packets 101 from other parts of the packet based voice communication system. The incoming voice packets 101 usually arrive in irregular time intervals due to problems with the uplink and/or downlink data streams in the packet based voice communication system. Some of the incoming packets are discarded since they are late due to latency in the network, meaning that the corresponding time segment of the voice call already has been rendered by a speaker of the receiver (e.g. the device 300). Some voice packets will be discarded due to that the jitter characteristics exceed the capability of the jitter buffer 102.

The receiving stage 102 further comprises a FEC recovery stage which implements FEC and uses a received FEC data 120 and a FEC scheme for recovering some of the lost voice packets.

The jitter buffer 102 may output voice packets 103 in evenly spaced time intervals. Optionally the Jitter buffer 102 may also create packets representing to the lost voice packet which was not recovered using FEC, mark them as such and include them in the outputted voice packets 103 in evenly spaced time intervals. The jitter buffer 102 may also mark any recreated voice packet using FEC as such. The mark for lost voice packet or recreated voice packet may be a single bit in the outputted voice packets, e.g. a zero if the voice packet is recovered using FEC and a one if the voice packet represents a lost voice packet. The Jitter buffer may for example use sequence numbers included in the voice packets in order to determine if packets are lost or not and where those lost voice packets originally (when transmitted) were located in the stream of voice packets.

The stage 104 for decoding and PLC decodes the contents (payload) of the stream of voice packets to synthesize voice waveforms. If there are losses in voice packets, possibly marked by the Jitter buffer 102 or otherwise known to the stage 104 (e.g. by a running number in each voice packet), PLC is employed to estimate voice waveforms of the lost packets by using the previously received voice packets.

The remaining parts of the device 300 are the parts that perform the estimation of the impact of lost packets on the perceived voice quality, i.e. the part that calculates the voice quality estimate 112. The calculated voice quality estimate 112 may be outputted in the mean opinion score (MOS) scale.

The outputted voice packets 103 from the unit 102 are received by a packet loss statistics (PLS) calculating unit 106 (i.e. a calculation stage of the device 100). The PLS calculation unit 106 comprises a receiving stage which is adapted to receive data comprising a sequence of encoded voice packets 103 transmitted from one or more end-points in the voice communication system. As described above, some of the encoded voice packets transmitted from the one or more end-points may have been lost during the transmission from the one or more end-points to the device 100 or discarded by the Jitter buffer 102 for being late. Some of the lost voice packets were recreated by the FEC 102. In any event, these lost packets may cause a reduced perceptual quality of the voice call which the encoded voice packets relate to.

The PLS calculation unit 106 is configured to calculate, based on the received sequence 103 of encoded voice packets, a statistical metric 107 relating to a number of lost voice packets. The statistical metric 107 as described above may comprise or be calculated using at least one of: a total number of transmitted voice packets from the one or more end-points in the voice communication system including a number of the one or more lost voice packets, a number of groups of consecutive lost voice packets, and the number of the one or more lost voice packets. According to some embodiments, the PLS calculation unit 106 take any recovered voice packets into account when calculating the statistical metric 107 and remove these from the lost voice packets, but according other embodiments, the PLS calculation unit 106 disregards any recovered voice packets when calculating the statistical metric 107.

The statistical metric 107 is then transmitted from the PLS calculation unit 106 to the PLS modification unit 114 (e.g. a statistical modification stage of the device 300). The PLS modification unit 114 is further receiving recovery data 113 relating to recovered voice packets among the one or more of the lost voice packets. According to some embodiment, the recovery data comprises information pertaining to a recovery factor of each of the recovered voice packets. Such recovery factor may be determined in many different ways. According to some embodiment, the recovery factor is received along with the FEC data 120 and thus determined by e.g. the transmitting end point in the packet based voice communication system. According to some embodiments, the recovery factor is pre-determined or pre set within the packet based communication system and thus known to the decoder. According other embodiments, the recovery factor for a recovered voice packet is calculated by the device 300 using a pre trained mapping function trained for determining a recovery factor based on the used FEC scheme and the received FEC data 120. For example, the FEC data may be received in the form of data packets, wherein a header of each data packet comprises information pertaining to the recovery factor of the one or more recovered voice packets. The headers may comprise the recovery factor, or the information in the headers may be used as input to the above described pre trained mapping function. As exemplified above, the FEC data 120 may comprise replica data encoded with a codec having a first bit rate, and the encoded voice packets 101 may be encoded with a codec having a second bit rate being higher than the first bit rate. In this case, the recovery factor of a recovered voice packet may be determined based on a ratio between the first bit rate and the second bit rate.

As described above, the PLS modification unit 114 is configured for modifying the statistical metric 107 based on the recovery data 113. Such modification is schematically shown in FIG. 4.

Figure 4:
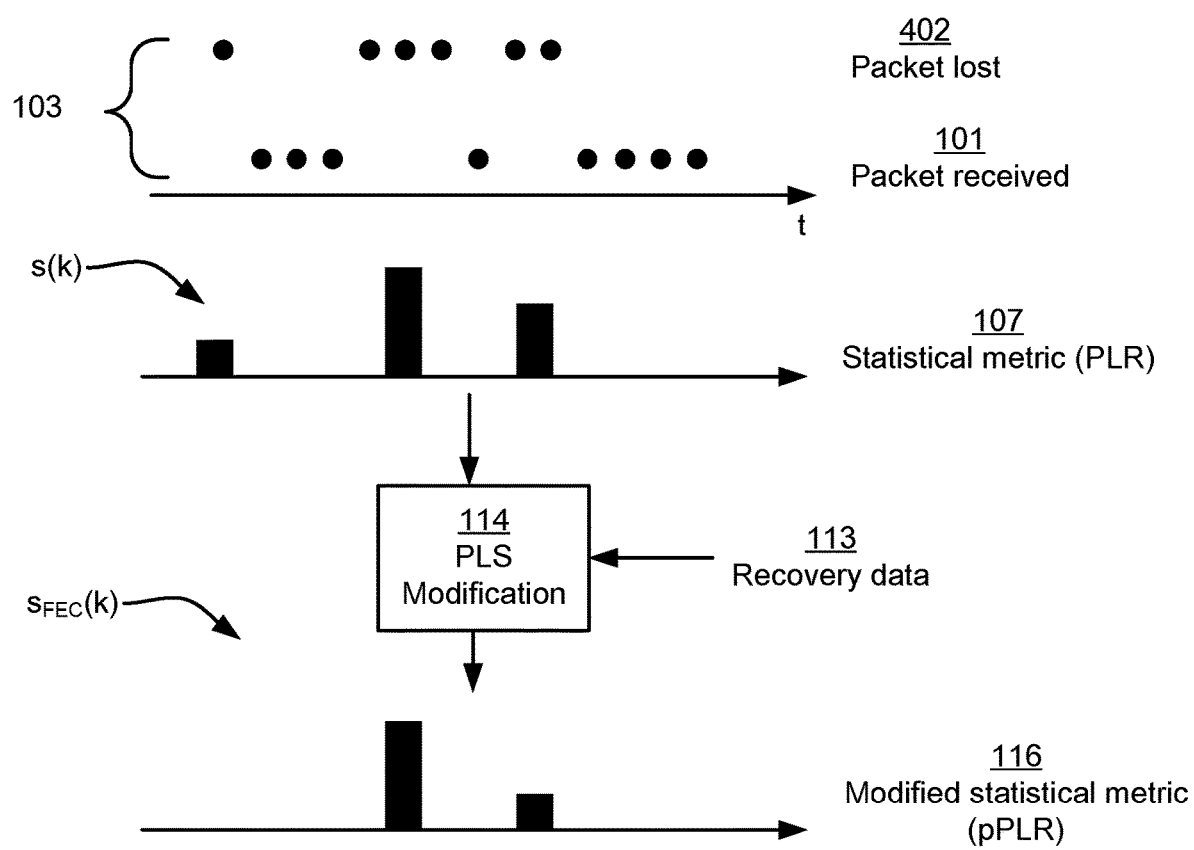
FIG. 4 shows by way of example a modification of a statistical metric relating to groups of consecutive lost voice packets, wherein the modification is based on a FEC scheme and FEC data used for recovering some of the lost voice packets.

The upper part of FIG. 4 exemplifies a relation between received packets 101 and lost packets 402 in encoded voice packets transmitted from the one or more end-points to the device 100. As described above in conjunction with FIG. 3, the Jitter buffer 102 may include packets representing the one or more lost voice packets 402 in the data 103 received by the PLS calculation unit. These packets may be empty and/or comprising data indicating that they represent a lost packet. This is described in FIG. 4 where the data 103 comprises the empty packets representing the one or more lost voice packets 402. According to some embodiments, any recovered packets are still considered as lost by the PLS calculation unit 106, while in other embodiments, the recovered packets is considered as not lost by the PLS calculation unit 106.

Given a time series of lost voice packets that can be obtained from 103, a packet loss event function, s(k) can be defined, which represents the number of consecutive lost packets at the k-th group a loss event, for k=1, 2, ..., K, where K is the number of groups of consecutive lost packets. In FIG. 4, the number of such groups is 3. The packet loss event function s(k) in this example is a vector with the values [1, 3, 2].

FIG. 4 further describe how the statistical metric 107 (in this case the vector s(k)) is inputted to the PLS modification unit 114 which modifies the statistical metric 107 based on recovery data 113. The PLS modification unit 114 transforms the vector s(k) to a new vector $s_{FEC}(k)$. The packet loss event function $s_{FEC}(k)$ in this example is a vector with the values [0, 3, 1].

For some FEC schemes, a lost voice packet is not fully recovered. For example, for a media specific FEC scheme, a lost voice packet may be replaced by a lower bit rate version of the original voice packet. In other words, the replica data for a certain voice packet may be encoded with a codec having a first bit rate, wherein the certain voice packet itself is encoded with a codec having a second bit rate being higher than the first bit rate. For media independent FEC, the same thing may apply when the redundant data for a certain voice packet (e.g. block codes) are calculated for not recovering the full voice packet but only parts of it. In these embodiments, it may be advantageously to introduce a further parameter when modifying the statistical metric, i.e. a recovery factor of each of the recovered voice packets. The recovery factor parameter and its implication for such modification of statistical metrics will be exemplified in conjunction with FIG. 5.

Figure 5:
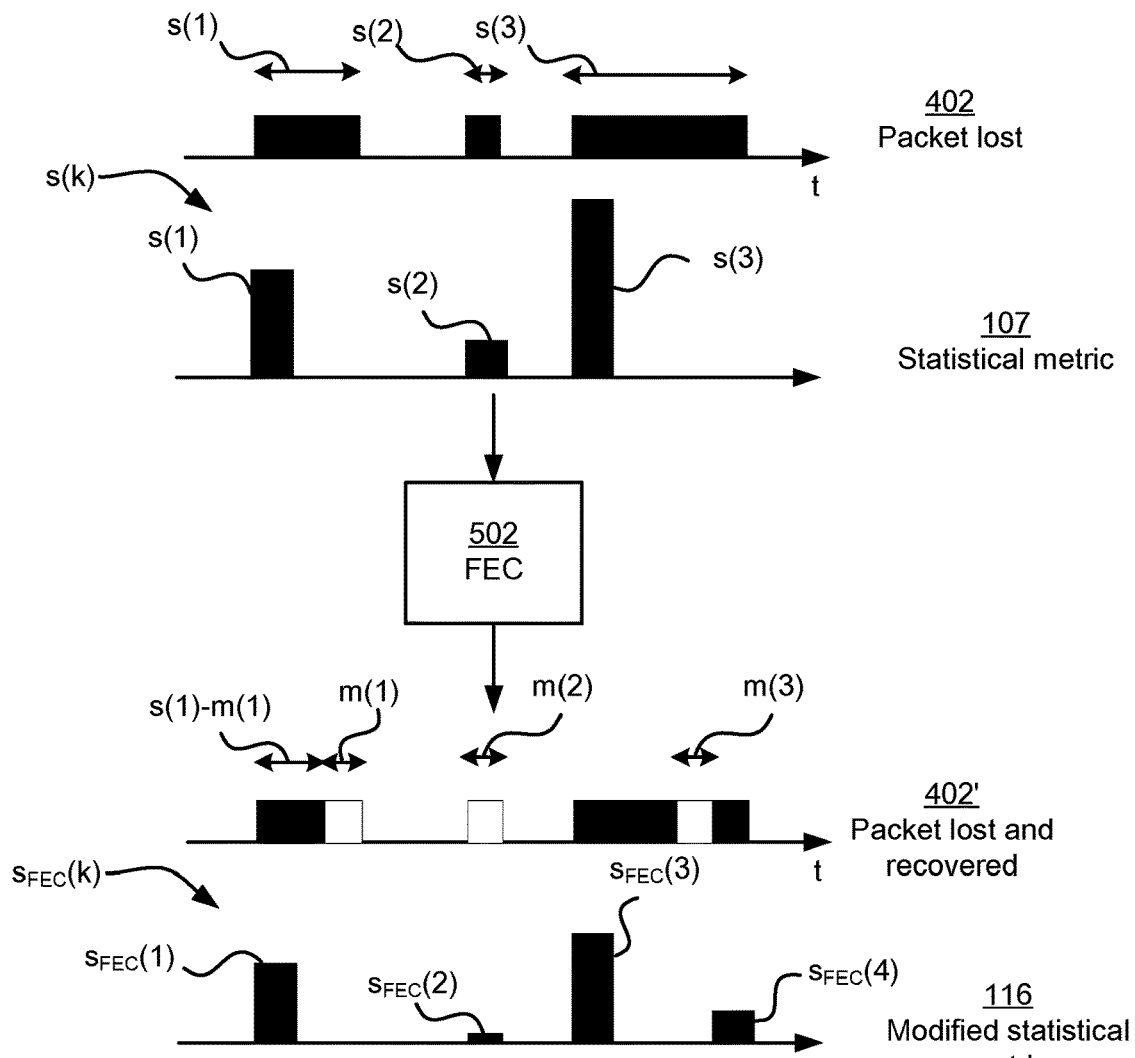
FIG. 5 shows by way of example a modification of a statistical metric relating to groups of consecutive lost voice packets, wherein the modification is based on a recovery factor of recovered voice packets.

The upper part of FIG. 5 shows the relation between the number of lost packets 402 in encoded voice packets transmitted from the one or more end-points to the device 100 and the packet loss event function, s(k). In this embodiment, the number of consecutive lost packets in a group, e.g. the first group has tree lost packets, equals s(k), e.g. s(1)=3. The packet loss event function, s(k), thus represents the number of consecutive lost packets at the k-th group a loss event, for k=1, 2, ..., K, where K is the number of groups of consecutive lost packets. From s(k), the packet loss rate (PLR) can be calculated by $$PLR = \sum_{k=1}^{K} s(k)/M \qquad (1)$$

where M is the total number of packets received 101 and packets lost 402.

Also, the burstiness factor can be calculated from s(k) by $$BF = K/S \qquad (2)$$

where S is the number of lost voice packets.

However, when FEC is used, which do not perfectly recover lost voice packets; this may advantageously be taken into account when modifying the statistical metrics in order to calculate e.g. a $PLR_{FEC}$ and/or a $BF_{FEC}$.

Some of the lost packets 402 is thus recovered using FEC 502. This is shown in the lower part of FIG. 5, which shows the relation between the lost packets and recovered packets 402' and the packet loss event function, $s_{FEC}(k)$ which represent the modified statistical metric 116.

The white squares with black border correspond to the lost voice packets that have been recovered by the decoder using FEC. For example, in the first group of consecutive lost packets (k=1), the last of the lost voice packets in the group has been recovered. In FIG. 5, the recovered voice packets are represented by the function m(k). Since the recovered packets may not be fully recovered, each recovered voice packet corresponds to a recovery factor. In the following, the recovery factor of all recovered voice packets is the same, but according to other embodiments, the recovery factor may vary between the recovered voice packets. The modified packet loss event function, $s_{FEC}(k)$, can be calculated by $$s_{FEC}(k) = s(k) - m(k) + (1-p)m(k) \qquad (3)$$

wherein p denotes the recovery factor of the recovered voice packets.

The packet loss event function s(k) in this example is a vector with the values [3, 1, 5] while the modified packet loss event function $s_{FEC}(k)$ is a vector with the values [2.2, 0.2, 3.2, 1] since the one lost voice packet in each group of consecutive lost voice packet were recovered (m(k)=1 for k=1, 2, 3), one group was split into two by a recovered voice packet, and the recovery factor for each recovered voice packet was determined to be 0.8.

Using equation 2, a modified packet loss rate, $PLR_{FEC}$, can be calculated based on the unmodified PLR (the number of lost voice packets in relation to a total number of transmitted voice packets), a number of the one or more recovered voice packet in relation to the total number of transmitted voice packets, and the recovery factor of each of the one or more recovered voice packet:

$$PLR_{FEC} = \sum_{k=1}^{K} s_{FEC}(k)/M \qquad (4)$$

which translates to:

$$PLR_{FEC} = PLR - p\sum_{k} m(k)/M \qquad (5)$$

When it comes to the modified burstiness factor, $BF_{FEC}$, which relate to the number of groups of consecutive lost voice packets (K), two special cases need to be considered. Firstly, all lost voice packets in a group of consecutive lost voice packets may be recovered. Secondly, a group of consecutive lost voice packets may be split in two by recovered voice packets. Consequently, FEC and the recovery factor of the recovered voice packets may influence the K-value such that further mappings of the recovery factor may advantageous be made for calculating a modified measure of the number of groups of consecutive lost voice packets, $K_{FEC}$. Such mapping may be made using a pre trained monotonically increasing non-linear mapping function, g(p). A modified statistical metric for the number of packet loss even groups, $K_{FEC}$, can thus be calculated by:

$$K_{FEC} = K - g(p)K_{mask} + g(l)K_{split} \qquad (6)$$

where $K_{mask}$ is the number of occurrences a loss event is completely masked by FEC, $K_{split}$ is the number of occurrences a loss event is split by FEC, and g(p) is a monotonically increasing function of p (0<=g(p)<=1).

A modified statistical metric of the number of lost packets, $S_{FEC}$, can be calculated using equation 3:

$$s_{FEC} = \sum_{k=1}^{K} s_{FEC}(k) \qquad (7)$$

which translates to:

$$s_{FEC} = S - p\Sigma_k m(k) \qquad (8)$$

Using equation 6 and 8, a modified burstiness factor, $BF_{FEC}$, can be calculated:

$$BF_{FEC} = 1 - \frac{K_{FEC}}{S_{FEC}} \qquad (9)$$

Now returning to FIG. 3, the modified statistical metrics may be used as input to a voice quality estimation stage 108. An example embodiment of the voice quality estimation stage 108 will now be described. According to this embodiment, the voice quality estimation stage 108 requires two inputs, which are a packet loss rate, i.e. PLR or $PLR_{FEC}$ and a burstiness value, i.e. BF or $BF_{FEC}$. According to other embodiment, statistical metrics for calculating the packet loss rate and the burstiness value may be used as input to the voice quality estimation stage 108. An advantage of the invention is that regardless of if the statistical metrics have been modified as described above or not, the same voice quality estimation algorithm may be used at the voice quality estimation stage 108. The voice quality estimation stage 108 comprises L regression models. L is a preset number of choices of burstiness factors. For example, the voice quality estimation stage 108 may comprise six regression models (L=6), each corresponding to a BF value of 0, 0.2, 0.4, 0.6, 0.8 and 1.0 respectively.

Given an input of a PLR value and BF value, two regression models are selected that have the closest proximity to the value of BF, and these two regression models estimate voice quality values from the PLR value. The final voice quality is estimated by the weighted sum of the two voice quality values.

However, in order to improve the accuracy of the voice quality estimate, the above described modification of the input to the voice quality estimating algorithm may be made. This use of the PLR and BF values in the voice quality estimation stage 108, with or without being weighted based on FEC and on the recovery factor of the recovered voice packets will now be described in conjunction with FIG. 6.

Figure 6:
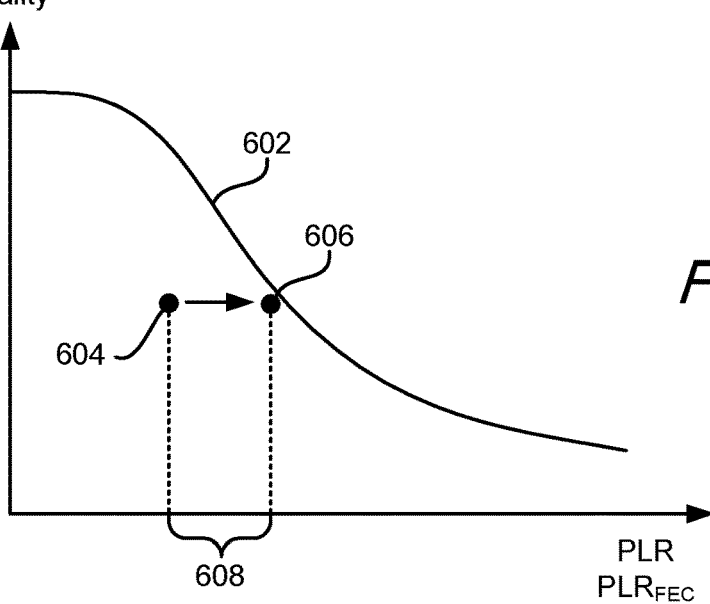
FIG. 6 shows by way of example how a prediction error of a voice quality estimate is reduced when modifying statistical metrics based on a FEC scheme and FEC data.

In FIG. 6, the regression curve 602 is determined based on the BF value. The form of the regression curve is based on empirical data of actual perceived voice quality and is thus a predefined reference. As described previously, the regression curve may also be determined based on modified BF value, $BF_{FEC}$.

FIG. 6 shows how the use of the $PLR_{FEC}$ value 606 as input to the voice quality estimation stage reduces the prediction error by a large value (referred to as 608 in FIG. 4) compared to using the conventional PLR value 604 as input. In other words, by applying the process to transform PLR to $PLR_{FEC}$, the data point 604 is translated to the data point 606, resulting in reduced voice quality estimation error using the same regression curve 602.

III. EQUIVALENTS, EXTENSIONS, ALTERNATIVES AND MISCELLANEOUS

Further embodiments of the present disclosure will become apparent to a person skilled in the art after studying the description above. Even though the present description and drawings disclose embodiments and examples, the disclosure is not restricted to these specific examples. Numerous modifications and variations can be made without departing from the scope of the present disclosure, which is defined by the accompanying claims. Any reference signs appearing in the claims are not to be understood as limiting their scope.

Additionally, variations to the disclosed embodiments can be understood and effected by the skilled person in practicing the disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The systems and methods disclosed hereinabove may be implemented as software, firmware, hardware or a combination thereof. In a hardware implementation, the division of tasks between functional units or stages referred to in the above description does not necessarily correspond to the division into physical units; to the contrary, one physical component may have multiple functionalities, and one task may be carried out by several physical components in cooperation. Certain components or all components may be implemented as software executed by a digital signal processor or microprocessor, or be implemented as hardware or as an application-specific integrated circuit. Such software may be distributed on computer readable media, which may comprise computer storage media (or non-transitory media) and communication media (or transitory media). As is well known to a person skilled in the art, the term computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Further, it is well known to the skilled person that communication media typically embodies computer readable instructions, data structures, program modules or other data in a modulated data signal such as a carrier wave or other transport mechanism and includes any information delivery media.

What is claimed is:

1. A method for modifying a statistical metric relating to lost voice packets in a packet based voice communication system, the method comprising:
    receiving a statistical metric, the statistical metric being calculated based on
        a sequence of encoded voice packets received by a decoder and transmitted from one or more end-points in the voice communication system, and on
        one or more lost voice packets which were lost during the transmission from the one or more end-points or discarded due to latency and/or jitter in the transmission,
    receiving recovery data relating to recovered voice packets among the one or more of the lost voice packets, wherein the recovered voice packets are recovered using a forward error correction, FEC, scheme and FEC data relating to the lost voice packets, and wherein the recovery data comprises information pertaining to a recovery factor of each of the recovered voice packets and wherein the recovery factor indicates whether a particular voice packet is fully or partially recovered,
    modifying the statistical metric based, at least in part, on the recovery factor, and
    transmitting the modified statistical metric to a voice quality estimator so as to reduce a prediction error of a voice quality estimate when using the modified statistical metric as input to a voice quality estimating algorithm of the voice quality estimator,
    wherein the recovery factor of a recovered voice packet is calculated using a pre trained mapping function trained for determining a recovery factor based on the used FEC scheme and the FEC data, and
    wherein the pre trained mapping function is pre-trained according to a subjective score given to a pool of speech data.

2. The method according to claim 1, wherein the statistical metric comprises or is calculated using at least one of:
    a total number of transmitted voice packets from the one or more end-points in the voice communication system including a number of the one or more lost voice packets,
    a number of groups of consecutive lost voice packets, and
    the number of the one or more lost voice packets.

3. The method according to claim 1, wherein FEC scheme is a media specific FEC scheme.

4. The method according to claim 1, wherein modifying the statistical metric comprises weighting of the statistical metric according to the recovery factor of each of the recovered voice packets.

5. The method of claim 4, wherein the FEC data are in the form of data packets, wherein a header of each data packet comprises information pertaining to the recovery factor of the recovered voice packets.

6. The method of claim 4, wherein the FEC data comprises replica data relating to at least some of the one or more of the lost voice packets, wherein the replica data is encoded with a codec having a first bit rate, wherein the encoded voice packets transmitted from the one or more end-points is encoded with a codec having a second bit rate being higher than the first bit rate, and wherein the recovery factor of a recovered voice packet is determined based on a ratio between the first bit rate and the second bit rate.

7. The method of claim 4, wherein the statistical metric comprises a number of groups of consecutive lost voice packets and a number of lost voice packets, and wherein modifying the statistical metric comprises:
    calculating a modified burstiness factor, $BF_{FEC}$, based on the number of groups of consecutive lost voice packets, the number of lost voice packets, the recovery factor of each of the one or more recovered voice packet, a number of groups of consecutive lost voice packets in which all consecutive lost voice packets in a group are recovered, and a number of groups of consecutive lost voice packets being split by a recovered voice packet.

8. The method of claim 7, wherein calculating a modified burstiness factor, $BF_{FEC}$, further comprises a mapping of the recovery factor of a recovered voice packet using a pre trained monotonically increasing non-linear mapping function.

9. The method of claim 4, wherein modifying the statistical metric comprises:
    calculating a modified packet loss rate, $PLR_{FEC}$, based on
        a packet loss rate, PLR, which is the number of lost voice packets in relation to a total number of transmitted voice packets,
        a number of the one or more recovered voice packet in relation to the total number of transmitted voice packets, and
        the recovery factor of each of the recovered voice packets.

10. The method of claim 4, wherein the recovery factor for each of the recovered voice packets are determined to be the same.

11. A computer program product comprising a non-transitory computer-readable storage medium with instructions adapted to carry out the method claim 1 when executed by a device having processing capability.

12. The method according to claim 1, wherein the pre-trained mapping function is pre-trained by a plurality of listeners giving the subjective score in response to listening to the pool of speech data.

13. The method according to claim 1, wherein the pre-trained mapping function is pre-trained according to the pool of speech data and a plurality of different embodiments of FEC.

14. The method according to claim 13, wherein the plurality of different embodiments of FEC includes a media independent FEC and a media specific FEC.

15. The method according to claim 13, wherein the plurality of different embodiments of FEC includes a block coding FEC, a convolutional coding FEC, and a replicating voice packet FEC.

16. A method for modifying a statistical metric relating to lost voice packets in a packet based voice communication system, the method comprising:
receiving data comprising a sequence of encoded voice packets transmitted from one or more end-points in the voice communication system, wherein the encoded voice packets transmitted from the one or more end-points comprise the received sequence of encoded voice packets and one or more lost voice packets which were lost during the transmission from the one or more end-points or discarded due to latency and/or jitter in the transmission and wherein the data further comprises forward error correction, FEC, data relating to the encoded voice packets transmitted from the one or more end-points,
calculating, based on the received sequence of encoded voice packets, a statistical metric relating to the lost voice packets,
recovering one or more of the lost voice packets using a FEC scheme and the FEC data relating to the lost voice packets,
generating a recovery factor for each recovered voice packet, the recovery factor indicating whether a particular voice packet is fully or partially recovered, and
modifying the statistical metric based, at least in part, on the recovered one or more voice packets, so as to reduce a prediction error of a voice quality estimate when using the modified statistical metric as input to a voice quality estimating algorithm,
wherein the recovery factor of a recovered voice packet is calculated using a pre trained mapping function trained for determining a recovery factor based on the used FEC scheme and the FEC data, and
wherein the pre trained mapping function is pre-trained according to a subjective score given to a pool of speech data.

17. A device for modifying a statistical metric relating to lost voice packets in a packet based voice communication system, the device comprising:
a receiver configured to:
receive a statistical metric, the statistical metric being calculated based on a sequence of encoded voice packets received by a decoder and transmitted from one or more end-points in the voice communication system, and on one or more lost voice packets which were lost during the transmission from the one or more end-points or discarded due to latency and/or jitter in the transmission, and receive recovery data relating to recovered voice packets among the one or more of the lost voice packets, wherein the recovered voice packets are recovered using a forward error correction, FEC, scheme and FEC data relating to the lost voice packets, and wherein the recovery data comprises information pertaining to a recovery factor of each of the recovered voice packets and wherein the recovery factor indicates whether a particular voice packet is fully or partially recovered, and
one or more processors configured to:
modify the statistical metric based, at least in part, on the recovery factor, and
transmit the modified statistical metric to a voice quality estimator so as to reduce a prediction error of a voice quality estimate when using the modified statistical metric as input to a voice quality estimating algorithm of the voice quality estimator,
wherein the recovery factor of a recovered voice packet is calculated using a pre trained mapping function trained for determining a recovery factor based on the used FEC scheme and the FEC data, and
wherein the pre trained mapping function is pre-trained according to a subjective score given to a pool of speech data.

18. A device for modifying a statistical metric relating to lost voice packets in a packet based voice communication system, the device comprising:
a receiving stage configured to receive data comprising a sequence of encoded voice packets transmitted from one or more end-points in the voice communication system, wherein the encoded voice packets transmitted from the one or more end-points comprise the received sequence of encoded voice packets and one or more lost voice packets which were lost during the transmission from the one or more end-points or discarded due to latency and/or jitter in the transmission, wherein the data further comprises forward error correction, FEC, data relating to the encoded voice packets transmitted from the one or more end-points,
a calculating stage configured to calculate, based on the received sequence of encoded voice packets, a statistical metric relating to a number of lost voice packets,
a FEC recovery stage for recovering one or more of the lost voice packets using a FEC scheme and the FEC data relating to the lost voice packets,
a recovery factor calculation stage for generating a recovery factor for each recovered voice packet, the recovery factor indicating whether a particular voice packet is fully or partially recovered, and
a statistical modification stage configured to modify the statistical metric based, at least in part, on the recovered one or more voice packets, so as to reduce a prediction error of a voice quality estimate when using the modified statistical metric as input to a voice quality estimating algorithm,
wherein the recovery factor of a recovered voice packet is calculated using a pre trained mapping function trained for determining a recovery factor based on the used FEC scheme and the FEC data, and
wherein the pre trained mapping function is pre-trained according to a subjective score given to a pool of speech data.

* * * * *